United States Patent [19]

Shigehara et al.

[11] Patent Number: 4,907,038
[45] Date of Patent: Mar. 6, 1990

[54] LANGMUIR BLODGETT ULTRATHIN MEMBRANE OF POLYFUMARATE

[75] Inventors: Kiyotaka Shigehara, Tokyo; Akira Yamada, Kamifukuoka; Masahiko Hara, Shiki; Hidenari Nakahama, Ichihara; Seizo Miyata, Hoya; Yoshishige Murata, Ibaraki, all of Japan

[73] Assignees: Nippon Oil and Fats Co., Ltd., Tokyo; Rikagaku Kenkyusho, Saitama, both of Japan

[21] Appl. No.: 47,887

[22] Filed: May 8, 1987

[30] Foreign Application Priority Data

May 9, 1986 [JP] Japan .................. 61-104899
May 9, 1986 [JP] Japan .................. 61-104900

[51] Int. Cl.[4] ............................. H01L 27/24
[52] U.S. Cl. ............................. 357/1; 357/6; 357/23.15; 428/338; 428/910
[58] Field of Search ............... 357/6, 23.15, 721; 428/220, 338, 339, 910; 264/298

[56] References Cited

U.S. PATENT DOCUMENTS 3,892,665 7/1975 Steigelmann t al. ............ 264/298 X

OTHER PUBLICATIONS

Naegele, D. et al., "Polymerization of Cadmium Octadecylfumarate in Multilayers", Macromolecules, vol. 10, No. 6, 1977, pp. 1339-1344.
Rabe, J. P. et al., "Polymerization of Two Unsaturated Fatty Acid Esters . . . ", Thin Solid Films, vol. 133, 1985, pp. 153-159.
Laschewsky, A. et al., "Polymerization of Hydrocarbon and Fluorocarbon Amphiphiles . . . ", Thin Solid Films, vol. 134, 1985, pp. 153-172.

Primary Examiner—Andrew J. James
Assistant Examiner—Sara W. Crane
Attorney, Agent, or Firm—Darby & Darby

[57] ABSTRACT

A Langmuir-Blodgett ultrathin membrane is constituted of polyfumarate having a degree of polymerization of 20 to 10,000. The polyfumarate is obtained by polymerizing fumarate represented by the general formula of:

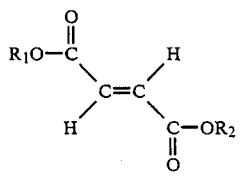

wherein at least one of $R_1$ and $R_2$ represents a bulky hydrocarbon group such as a branched alkyl group, a cycloalkyl group or a substituent thereof, a fluorine-substituted hydrocarbon group, a hetero atom-containing hydrocarbon group or a silicon-containing group.

9 Claims, 1 Drawing Sheet

LANGMUIR BLODGETT ULTRATHIN MEMBRANE OF POLYFUMARATE

BACKGROUND OF THE INVENTION:

1. Field of the Invention;

This invention relates to a polymer Langmuir-Blodgett ultrathin membrane, hereafter abbreviated to LB membrane or LB ultrathin membrane. More particularly, it relates to a smooth and homogeneous LB membrane constituted of polyfumarate.

2. Related Art Statement;

As the methods for preparing a smooth and homogeneous organic ultrathin membrane having a uniform molecular orientation, it has been customary to use a Langmuir-Blodgett method, referred to herein as the LB method. The LB method means a vertical dipping method according to which a dilute solution of organic solvents immiscible with water is prepared and spread on a clean water surface, a gaseous membrane which is left after vaporization of the solvent is compressed in a horizontal direction to form a solid membrane with the molecules packed tightly together, and then a solid substrate plate is moved vertically with respect to the horizontal plane for transferring and stacking the solid membrane in plural layers on the surface of the solid substrate plate. The ultrathin film formed in this manner on the substrate is called the LB membrane, see for instance the literature by K. B. Blodgett, JACS., 55, 1007 (1935). On the other hand, a horizontal lifting method has also been evolved according to which the layers of the solid membrane is transferred by vertically moving the substrate plate so that the substrate plate is horizontally contacted with the surface of the solid membrane, see the literature by K. Fukuda, J. Colloid Interface, 54,430(1976). Currently, the ultrathin membrane formed on the substrate plate by the horizontal lifting method is also called the LB membrane. It is a feature of both the vertical dipping and horizontal lifting methods that a smooth and homogeneous membrane with a desired thickness and a uniform molecular orientation may be produced and that the produced membrane may range from an ultrathin membrane of the thickness of the order of a molecular thickness, e.g. monomolecular layer to a multilayered membrane of desired thickness produced by repeatedly transferring the monomolecular layers.

Alternatively, electrical elements such as varistors, thyristors, diodes, photodiodes, light emitting diodes and transistors as well as LSIs composed of these electrical elements, may be basically classified into metal/insulator/metal (MIM), metal/insulator/semiconductor (MIS), metal/semiconductor or Schottky element (MS), semiconductor/semiconductor(SS; p,n-junction) and semiconductor/insulator/semiconductor (SIS). The MIM, MIS and SIS elements need be formed with insulator layers and are usually prepared by oxidizing the surface of an aluminum or beryllium substrate or a silicon substrate to form an insulating film of reduced thickness of $SiO_2$ or metal oxide followed by formation of a counter electrode. However, this technology cannot be adapted to metal or semiconductor substrates other than the abovementioned substrates. The adaptation to versatile MIS type elements such as diodes, photodiodes, light emitting diodes or field effect transistors is not possible when using inter alia semiconductors other than Si, including compound semiconductors. Therefore, all possible combinations can be achieved by using an organic insulating ultrathin membrane as the insulating layer. It is required that such insulating ultrathin membrane be of a thickness of not higher than 50 Å and preferably not higher than 20 Å while being smooth and homogeneous. Accordingly, it has been tried to apply the above described LB membrane as the electrical element.

As a typical example of such trials, formation of the LB membrane of straight-chain fatty acids having not less than 16 carbon atoms, or alkaline earth metal or cadmium salts thereof, has been considered extensively, see for example G. G. Roberts: IEE, Proc. Solid State Electron Device, Vol.2, p169, 1978. However, the LB membrane of these fatty acids or metal salts thereof are low in mechanical strength and heat resistance and therefore cannot be used practically. Accordingly, it has been suggested to form the polymerizable fatty acid into an LB membrane prior to polymerization followed by polymerizing the membrane or to polymerize on the water surface followed by forming an LB membrane. With the former method, however, the membrane is frequently constricted or cracked during polymerization. With the latter method, difficulties are encounted in setting the polymerization conditions and, above all, in transferring the membrane onto the substrate surface by the vertical dipping or horizontal lifting methods. Thus, it has been desired to produce a polymer LB membrane superior in mechanical strength and heat resistance.

In general, a soft linear chain high molecular material forms more or less intricately entangled strands in any dilute solution and is not suitable for being formed into LB membranes since gaseous membranes are not formed when spreading out the solution on the water surface. As an exception, an LB membrane of polypeptides and ($\alpha$-olefin)-maleic anhydride alternating copolymers have been reported, see the literature by J. H. McAlear, VLSI Tec., Digest of Tec. Papers 82(1981); C. S. Winter et al, IEE Proc., Part I, Solid State Electron Devices, 130, 256(1983); and R. H. Tredgold et al, Thin Solid Films, 99, 81(1983). However, the former material is soluble only in a special multi-component solvent such as chloroform/trichloroacetic acid/methanol while trichloro acetic acid used as the essential component for maintaining the solubility is highly likely to deteriorate the metal surface used a the substrate. The latter material corrodes metal or semiconductor surfaces.

OBJECTS AND SUMMARY OF THE INVENTION

It is a principal object of the present invention to provide a polymer Langmuir-Blodgett ultrathin membrane which is smooth, homegeneous and superior in mechanical strength and heat resistance, a method for preparing such membrane, and an electrical element including such membrane.

It is another object of the present invention to provide a polymer Langmuir-Blodgett ultrathin membrane superior in moisture- and weather-resistance, transparency and insulating properties, a method for producing such membrane and an electrical element including such membrane.

It is a further object of the present invention to provide a polymer Langmuir-Blodgett ultrathin membrane that is free of membrane constriction or crack formation and that can be laminated to a desired thickness, a method for producing such membrane and an electrical element including such membrane.

These and other objects will become clear from the following description of the present invention.

According to the present invention, there is provided a Langmuir-Blodgett ultrathin membrane constituted of polyfumarate having a degree of polymerization of 20 to 10,000 and obtained by polymerizing fumarate represented by the general formula of:

wherein $R_1$ and $R_2$ represent the same or different groups and at least one of $R_1$ and $R_2$ represents a hydrocarbon group selected from the group consisting of a branched alkyl group having 3 to 12 carbon atoms, a cycloalkyl group having 3 to 12 carbon atoms, a substituted alkyl group having 2 to 6 carbon atoms and containing a ring structure substituent having 3 to 14 carbon atoms, and a substituted cycloalkyl group having 3 to 10 carbon atoms and containing a substituent of the same ring structure as the ring structure substituent; trifluoromethyl, pentafluoroethyl, heptafluoro-n-propyl or a fluorine-substituted hydrocarbon group obtained by substituting at least one of hydrogen atoms of the hydrocarbon group with a fluorine atom; a hetero atom-containing hydrocarbon group containing in the hydrocarbon group a hetero atom selected from the group consisting of nitrogen, oxygen, phosphorus and sulfur atoms and not containing mobile hydrogen atom or atoms; or an organosilyl group, an organosilylalkyl group, an organosiloxanyl group, an organosiloxanylalkyl group, an organosiloxanylsilylalkyl group or an organosiloxanyloxysilylalkyl group, each having 1 to 8 silicon atoms.

According to the present invention, there is also provided an electrical element including the aforementioned Langmuir-Blodgett ultrathin membrane as an insulating layer.

According to the present invention, there is also provided a process for preparing a Langmuir-Blodgett ultrathin membrane comprising the steps of:

dissolving the aforementioned polyfumarate in a vaporizable organic solvent immiscible with water to produce a polyfumarate solution having a concentration of not higher than 10 mg/ml;

spreading out the polyfumarate solution on a clean water surface to produce a gaseous membrane having a surface pressure of not higher than 1 dyne/cm;

horizontally applying a pressure to the gaseous membrane to produce on said water surface a monolayer solid membrane having a surface pressure of 10 to 30 dyne/cm; and transferring the monolayer solid membrane onto a substrate plate.

DESCRIPTION OF THE INVENTION:

According to the present invention, a polyfumarate is used which is obtained by polymerizing fumarate represented by the following general formula:

In the above formula, $R_1$ and $R_2$ represent the same or different groups. At least one of $R_1$ and $R_2$ may represent a hydrocarbon group selected from the group consisting of a branched alkyl group having 3 to 12 carbon atoms, a cycloalkyl group having 3 to 12 carbon atoms, a substituted alkyl group having 2 to 6 carbon atoms and containing a ring structure substituent having 3 to 14 carbon atoms, and a substituted cycloalkyl group having 3 to 10 carbon atoms and containing a substituent of the same ring structure as the ring structure substituent. At least one of $R_1$ and $R_2$ may represent trifluoromethyl, pentafluoroethyl, heptafluoro-n-propyl or a fluorine-substituted hydrocarbon group obtained by substituting at least one of hydrogen atoms of the hydrocarbon group with a fluorine atom. At least one of $R_1$ and $R_2$ may also represent a hetero atom-containing hydrocarbon group containing in the hydrocarbon group a hetero atom selected from the group consisting of nitrogen, oxygen, phosphorus and sulfur atoms and not containing mobile hydrogen atom or atoms; or an organosilyl group, an organosilylalkyl group, an organosiloxanyl group, an organosiloxanylalkyl group, an organosiloxanylsilylalkyl group or an organosiloxanyloxysilylalkyl group, each having 1 to 8 silicon atoms. At any rate, it is required that one of the groups $R_1$ and $R_2$ represents at least the aforementioned group and, insofar as such condition is satisfied, the other group may be any other hydrocarbon groups, such as straight-chain alkyl or alkenyl groups or any other organic residues having a cyclic structure, such as an aryl group.

The specific examples of fumarate wherein $R_1$ and/or $R_2$ represent the aforementioned hydrocarbon groups include dicyclohexyl fumarate, dicyclopentyl fumarate, isopropylcyclohexyl fumarate, ethylcyclohexyl fumarate, sec-butylcyclohexyl fumarate, t-butylcyclohexyl fumarate, allylbenzyl fumarate, cyclohexylbenzyl fumarate, di-isopropyl fumarate, isopropylbenzyl fumarate, isopropylphenyl fumarate, cyclohexyl phenyl fumarate, di-isobutyl fumarate, tert-butyl-methyl fumarate, tertbutyl-ethyl fumarate, tert-butyl-iso-propyl fumarate, tert-butyl-n-propyl fumarate, tert-butyl-n-butyl fumarate, tert-butyl-iso-butyl fumarate, tert-butyl-sec-butyl fumarate, di-tert-butyl fumarate, tert-butyl-cyclopentyl fumarate, tert-butyl-cyclohexyl fumarate, tert-butyl-2-ethylhexyl fumarate, tert-butyl-biscyclohexyl fumarate, tert-butyl-benzyl fumarate, tert-butyl-phenetyl fumarate, tert-butyl-α-phenetyl fumarate and di-isopentyl fumarate.

The specific examples of fumarate wherein the group $R_1$ and/or $R_2$ represent trifluoromethyl, pentafluoroethyl, heptafluoro-n-propyl or a fluorine-substituted hydrocarbon group obtained by substituting at least one of the hydrogen atoms of the aforementioned hydrocarbon group with a fluorine atom, include perfluorooctylethyl-isopropyl fumarate, trifluoromethyl-isopropyl fumarate, pentafluoroethyl-isopropyl fumarate, and heptafluoro-n-propyl-isopropyl fumarate.

The specific examples of fumarate wherein the group $R_1$ and/or $R_2$ represent a hetero atom-containing hydrocarbon group containing a hetero atom selected from the group consisting of a nitrogen atom, an oxygen atom, a phosphorus atom or a sulfur atom and not containing a group containing a mobile hydrogen atom or atoms, such as primary amide, secondary amide, hydroxy or thiol, include cyanoethyl-isopropyl fumarate, glycidyl-isopropyl fumarate, diethylphosphonomethyl-isopropyl fumarate, and 2-methylthioethyl-isopropyl fumarate.

The specific examples of fumarate wherein the group $R_1$ and/or $R_2$ represent an organosilyl group, an organosilylalkyl group, an organosiloxanyl group, an organosiloxanylalkyl group, an organosiloxanylsilylalkyl group or an organosiloxanyloxysilylalkyl group, include methyl-(trimethyl-silyl)-fumarate, ethyl-(trimethylsilyl)fumarate, isopropyl-(trimethylsilyl)-fumarate, cyclohexyl(trimethylsilyl)-fumarate, tert-butyl-(trimethylsilyl)fumarate, methyl-(trimethylsilyl) methylfumarate, ethyl-(3-trimethylsilyl) propyl-fumarate, isopropyl-(trimethylsilyl)methyl-fumarate, isopropyl-(3trimetylsilyl) propyl-fumarate, isopropyl-{3-tris(-trimethylsiloxy)silyl}propyl-fumarate, isopropyl-3-{methylbis(trimethylsiloxy)silyl} propyl-fumarate, t-butyl-(trimethylsilyl)ethyl-fumarate, t-butyl-3-{tris(-trimethylsiloxy)silyl}propyl-fumarate, t-butyl-3-{(heptamethyl)trisiloxanyl} propyl-fumarate, 2-ethylhexyl-3-(trimethylsilyl)propyl-fumarate, 2-ethylhexyl-3-{tris(-trimethylsiloxy)silyl} propyl-fumarate, 2-ethylhexyl-3-{(pentamethyl)disiloxanyl} propyl-fumarate, cyclohexyl {(trimethyl)silyl} methyl-fumarate, cyclohexyl-3-{tris(trimethylsiloxy)silyl}propyl-fumarate, isopropyl-3-{(pentamethyl)disiloxanyl}propyl-fumarate, isopropyl-3-[{tris (pentamethyl)disiloxanyloxy}silyl]propyl-fumarate, cyclohexyl-3-[{tris(pentamethyl)disiloxanyloxy}silyl]propyl-fumarate and t-butyl-3- {tris(pentamethyl) disiloxanyloxy silyl]propyl-fumarate.

In preparing polyfumarate of the present invention, the conventional radical polymerization process is selected. The polymerization initiators used in the polymerization may include one or more of azo compounds and organic peroxides having a decomposition temperature of not higher than 120° C at selected half-life value for 10 hours.

These initiators may be enumerated by benzoyl peroxide, diisopropyl peroxycarbonate, t-butylperoxy -2-ethyl hexanoate, t-butylperoxypivalate, t-butylperoxy diisobutylate, lauroyl peroxide and azobisisobutyronitrile. The polymerization initiator may be used preferably in an amount of not larger than 10 wt. parts and more preferably in an amount of not larger than 5 wt. parts to 100 wt. parts of the starting monomer.

According to the present invention, polyfumarate having a degree of polymerization of 20 to 10,000 is used. If the degree of polymerization is less than 20, an LB membrane insufficient in mechanical strength and heat resistance is obtained. On the other hand, it is difficult to prepare a polyfumarate having a degree of polymerization of more than 10,000.

In preparing polyfumarate, it is preferred that the polymerization system be put under an atmosphere of an inert gas, such as nitrogen, carbon dioxide or helium. The polymerization temperature may be in the range of from 30° to 0° C., depending on the kind of the polymerization initiator employed. The total time necessary for polymerization may be in the range of 10 to 72 hours.

The method for preparing the polymer LB membrane using the aforementioned polyfumarate is hereafter explained.

The polyfumarate is first dissolved in a vaporizable organic solvent immiscible with water to produce a polyfumarate solution having a concentration of not higher than 10 mg/ml. This solution is then spread on clean water surface for vaporizing the organic solvent. Examples of the vaporizable organic solvent include chloroform, ethylene chloride, ethylene dichloride and benzene. At the usual operating temperature of 10° to 35° C., chloroform is vaporized moderately and hence is most preferred. As the operating temperature becomes higher, it is preferred to use a higher boiling solvent such as benzene or ethylene dichloride and a more dilute solution. Since the polyfumarate of the present invention has a glass transition temperature Tg or decomposition temperature of not lower than 200° C., it can be formed into an LB membrane at a higher temperature reaching 70° to 80° C. Therefore, not only the operating conditions are wider but it also becomes possible to produce a mixed LB membrane from a mixture containing functional molecules other than polyfumarate, such as dyestuff, that may be dissolved only at a higher temperature. Further, due to its high transition temperature Tg, polyfumarate LB membrane is not fabricated at the sub-phase temperature (See Example 1). It is necessary that the polyfumarate concentration in the organic solvent be not higher than 10 mg/ml and more preferably in the range of 0.1 to 3 mg/ml. With the concentration in excess of 10 mg/ml, the organic solvent is vaporized off before the polyfumarate solution is completely spread out on the water surface, while droplets go into water without being spread on the water surface due to increased specific gravity. The sub-phase solution or aqueous solution should be free of organic impurities and its surface should be clean in order to prevent the impurity from becoming affixed to or destructing the LB membrane. However, the LB membrane of the invention is totally insensitive to inorganic additives in a sub-phase such as inorganic neutral sals, acids or bases.

Since the polymer LB membrane of the present invention makes use of a specified polyfumarate having bulky side chains or specified side chains including silicon atoms, the polyfumarate is not in the from of entangled strands when the organic solvent is spread on the water surface and vaporized off but a gaseous membrane having a surface pressure of not higher than 1 dyne/cm, that is, a membrane having its molecules movable with the same degree of freedom as the gas, is formed on the water surace.

Then pressure is applied in the horizontal direction on the gaseous membrane thus spread on the water surface and having the surface pressure of not higher than 1 dyne/cm for forming a monolayer solid membrane having the surface pressure of 10 to 30 dyne/cm on the water surface. For applying the horizontal pressure, a float having the same width as the weir filled with water is placed on the water surface and gradually moved in the predetermined direction for applying the desired pressure on the gaseous membrane.

The value of surface pressure depends on the kind of the polyfumarate employed. Thus, such an artifice may be employed in which the surface pressure is set to that of the acute rising portion of a previously obtained surface pressure-surface area isothermal curve corresponding to the solid membrane phase. At any rate, tne surface pressure of the produced monolayer solid membrane should be in the range of 10 to 30 dyne/cm.

Then a substrate plate is contacted with a monolayer solid membrane floating on the water surface for transferring the monolayer solid membrane onto the substrate surface. In this manner, the monolayer solid membrane having the thickness of approximately 10 to 11 Å may be transferred onto the substrate surface. Alternatively, the monolayer solid membrane of the desired thickness may be laminated on the substrate surface by repeatedly performing the operation of vertically introducing the substrate into the water and lifting the substrate (vertical dipping method), or the operation of contacting the substrate plate with the monolayer solid membrane on the water surface in parallel with the water surface (horizontal lifting method). According to the present invention, the membrane thickness may range from about 10 Å for a monolayer solid membrane to the order of microns or more for the multilayered membrane produced by the repetition of the above described laminating steps.

With the vertical dipping method, the up-down speed of the substrate plate markedly influences the properties of the produced LB membrane. With the fatty acid, for example, defects in the membrane will become apparent unless the up-down speed of not higher than 0.5 to 1 mm/min is used. With the formation of the LB membrane from the fumarate of the present invention, however, the solid membrane may be transferred even with a rather high substrate plate speed of 10 mm/min. At least the defect of a size not less than 0.05 micron has not been observed on the photo of the membrane formed by 20 laminated layers of poly(di-isopropyl)-fumarate, the photo being taken with a differential interference contrast optical microscope having a magnification factor of 400 and enlarged to 1000 times for observation. Conversely, larger defects of the order of 1 to 5 microns may be sporadically observed on the LB membrane of cadmium eicosanoate produced by transferring the layers laminated under the same conditions. Although the LB membrane layers of the present invention can be transferred at the substrate plate speed of not higher than 10 mm/min, the speed of not higher than 5 mm/min is preferred in view of safety and the speed of 2 to 3 mm/min is more preferred in view of operability. With the horizontal lifting method, it is desirable that the substrate plate speed at the instant that the solid membrane on the water surface contacts the substrate plate be controlled so as to be not higher than 5 mm/min and preferably in the range of 1 to 3 mm/min.

With the vertical dipping method, almost any metals, plastics, ceramic materials or water-insoluble inorganic solid crystals such as fluorspar ($CaF_2$) may be used as the substrate material, with the exception of strongly hydrophilic material, such as polyvinyl alcohol or polyacrylamide or poly(tetrafluoroethylene). The layers can also be transferred on poly(tetrafluoroethylene) by the horizontal lifting method. It is only sufficient that the substrate presents a mirror surface free from grinding traces on observation with nacked eyes.

The LB membrane of the present invention produced in this manner may be used as an insulating layer for a number of electrical elements. In this case, the substrate may be formed of silicon, germanium, nickel, iron, cobalt, copper, platinum, gold, rare earth metals, metal oxides, or metal oxide semiconductors such as $SiO_2$, $NiO$, $SnO_2$, $In_2O_3$, indium tin nesa glass (Hereinafter referred to as ITO nesa) or tin oxide nesa glass (Hereinafter referred to as nesa), compound semiconductors such as gallium arsenic, gallium phosphorus or indium phosphorus, chalcogens, e.g. selenides or sulfides of transisition metals, such as zinc selenide or zinc sulfide, chalcogenides of $WO_3$ or $VO_2$, polycarbonates, polyethylene terephthalate, polyethylene or polypropylene, but these specific examples do not limit the present invention.

The electrical element including the polymer LB membrane according to the present invention may be obtained by forming on the LB membrane on the substrate a conducting or semi-conductor electrode by any suitable method including for example vacuum deposition, radio-frequency sputtering, ion beam sputtering or molecular beam epitaxy.

The electrical element including the LB membrane of the present invention makes use of a polyfumarate LB membrane as the insulating layer, with the polyfumarate LB membrane being superior in mechanical strength, heat, moisture- and light-resistance, transparency and insulating properties and being of the order of 10 Å in thickness, so that it can be applied to any material system of both metal and semiconductors. The following are typical of the electrical elements making use of the LB membrane of the present invention.

(i) metal/insulator/metal (MIM) type elements, that is, varistors or thyristors;

(ii) metal/insulator/semiconductor (MIS) type elements, that is, diodes, photodiods or light emitting diodes (LEDs);

(iii) p-semiconductor/insulator/n-semiconductor (SIS) type elements, that is, diodes, photodiodes or light emitting diodes (LEDs);

(iv) light integrated circuits or light wave guides as the interface for light fibers;

(v) insulating, heat resistant and transparent IC substrate;

(vi) submicron lithography; and (vii) gas-permeable membrane, especially of oxgen enrichment.

EXAMPLES OF THE INVENTION:

Referential Examples

Preparation of Polyfumarate

Referential Example 1

10 g of diisopropyl fumarate was taken in a glass ampoule and admixed with 0.1 g of 2,2′-azobisisobutyronitrile as the radical polymerization initiator. The inside space of the ampoule was replaced with nitrogen and degasified repeatedly, after which the ampoule was sealed tightly. The block polymerization was caused to occur at 40° C. for 48 hours. After polymerization, the contents were dissolved in benzene and the resulting solution was injected into a large quantity of methanol to precipitate the polymer. The precipitates were filtered off, sufficiently washed with methanol and dried in vacuum to produce the targeted poly(diisopropylfumarate) having a polymerization degree of 700, hereafter abbreviated to PDiPF.

Referential Example 2

10 g of di-tert-butyl fumarate was taken in a glass ampoule and admixed with 10 ml of benzene. 0.2 g of benzoylperoxide was added as the radical polymerization initiator. The inside space of the ampoule was repeatedly replaced with nitrogen and degasified, after which the ampoule was sealed tightly. Solution polymerization was caused to occur at 60° C. for 10 hours. After the polymerization, the operation was carried out similarly to the Referential Example 1 to produce the targeted poly(di-tert-butyl fumarate) having a polymerization degree of 600, hereafter abbreviated to PDtBF.

Referential Example 3

10 g of dicyclohexyl fumarate was taken in a glass ampoule and admixed with 0.1 g of 2,2azobisisobutyronitrile as the radical polymerization initiator. The inside space of the ampoule was repeatedly replaced with nitrogen and degasified, after which the ampoule was sealed tightly. Block polymerization was caused to occur at 60° C for 10 hours. The processing after the polymerization was carried out similarly to the Referential Example 1 to produce the targeted poly(dicyclohexyl fumarate) having a polymerization degree of 800, hereafter abbreviated to PDcHF.

EXAMPLE 1

Figure 1:
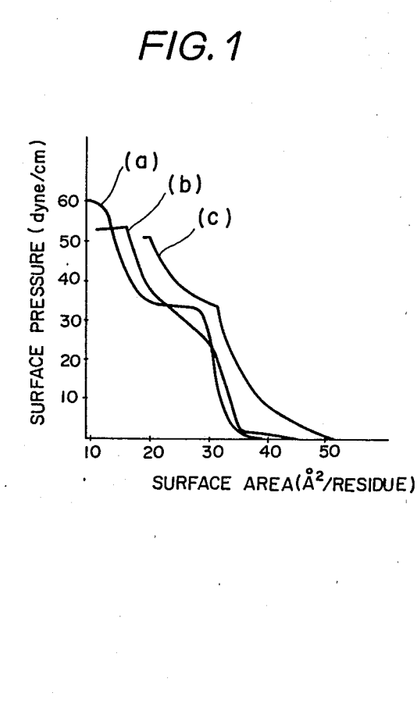
FIG. 1 is a chart showing surface pressure-surface area curves for various polyfumarates employed in the present invention.

Pure water was filled into a Teflon(Trademark) trough wth an inner surface area of 20×20 cm and a depth of 3 cm, so that water reached a depth of 2.5 cm, and the temperature in the whole room was set to 20° C. 150 μl of a PDiPF solution of the Referential Example 1 in chloroform (concetration : 1 mg/ml) was quietly spread on the water surface and the solvent was allowed to be vaporized off. A Teflon(Trademark) float, 20 cm long, was placed on the water surface and made to perform a translatory movement at a speed of 2 mm/min to narrow the area of the water surface, while the surface pressure was measured by taking the weight of a 2.5×5 cm filter paper of No.4 roughness which was installed so as to be dipped by half into the water. A surface pressure to surface area curve (FA curve) shown at (a) in FIG. 1 was obtained by measuring the surface area and the surface pressure. It may be seen from the curve (a) that PDiPF forms asolid membrane for the surface pressure within the range of 15 to 25 dyne/cm. A clean ITO nesa glass with a thickness of 1.0 mm and a surface area of 2.5×5 cm (surface resistance : 10 ohms/cm) was moved up and down relative to the water surface at a speed of 2.0 mm/min. LB membrane samples composed of one layer and twenty heaped layers were formed by the vertical dipping method while the Teflon float was moved so that the surface pressure was equal at all times to 20 dyne/cm. No membrane defects larger than 0.05 microns were observed on checking the photos of these LB membrane samples taken with a differential interference contrast optical microscope with a magnification ratio of 400 and developed by about 1000 times. The total thicknes as measured with a surface roughness meter of the LB membrane composed of the 20 heaped layers was 210 Å, from which the thickness per layer was found to be 10.5 Å.

After the LB membranes were placed in a dry argon atmosphere at 100° C. for 12 hours, they were again checked under the microscope while their thicknesses were again measured. It was seen that the LB membrane samples did not change.

Further experiments were made at elevated subphase temperatures of 30° C., 40° C., 60° C. and 80° C, respectively. As a result, it was found that the shapes of FA curves and the reproducibility of the LB membranes did not change. The same results were obtained with inorganic additives dissolved in the sub-phase at the temperatures above. The additives used were 0.1N-HCl, 0.1N-NaOH, and saturated NaCl, respectively.

COMPARATIVE EXAMPLE 1

The procedure of Example 1 was followed except that eicosanoic acid was used in place of PDiPF, cadmium chloride was charged into the water phase to a concentration of 4 mM and the surface pressure was kept to 15 dyne/cm in order to produce a LB membrane composed of 20 heaped layers of cadmium eicosanoate. The total membrane thickness of the LB membrane was found to be 220 Å from the known thickness per layer of cadmium eicosanoate of 28521 . As a counter electrode, an aluminum layer was formed on this LB membrane to a thickness of about 400 Å and the ITO and the aluminum layer were connected to a unit for measurement of the electrical conductivity in order to measure the electrical conductivity by the d.c. 2-terminal method at a voltage of 1 V. The conductivity was found to be not higher than $10^{-13}$ S/cm under an argon atmosphere at 20° C. The temperature was increased by increments of 5° C. while the LB membrane sample was allowed to stand for 12 hours for each temperature increment. It was seen that the insulation was destructed in the domain of from 45° to 50° C.

EXAMPLE 2

Figure 2:
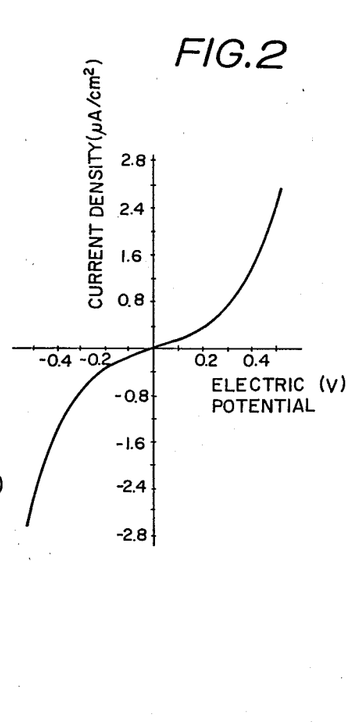
FIG. 2 is a chart showing current density-electric potential characteristics for a thyristor at 20° C according to the Example 2.

As the counter electrode, an aluminum layer was formed by vacuum deposition at $10^5$ torr to a thickness of about 400 Å on the LB membrane composed of 20 layers of PDiPF obtained by the Example 1, and both the ITO and the aluminum layer were connected to a conductivity measurement unit in order to measure the conductivity by the d.c. 2-terminal method at 1 V. The conductivity was found to be not higher than $10^{-13}$ S/cm under the argon atmosphere at 20° C. The temperature was increased by increments of 5° C. and the LB membrane sample was allowed to stand for 12 hours for each increment. It was found by the similar measurement that the insulating properties did not change until the temperature of 160° C. was reached. Alternatively, the ITO/PDiPF-LB membrane/aluminum three-layer structure with the membrane composed of one layer was equivalent to a thyristor and exhibited current density-electric potential (I-V) characteristics proper to a thyristor as shown in FIG. 2.

EXAMPLE 3

The surface pressure to surface area curve (FA curve) was prepared by following the procedure of Example 1 except that 1 mg/ml PDtBF solution in chloroform (Referential Example 2) was used in place of PDiPF. The results are as shown by a curve (b) in FIG. 1. Then, LB membrane samples formed of 1 layer and 20 heaped layers were produced at the surface pressure of 20 dyne/cm. The total membrane thickness was 220 Å, with the membrane thickness for one layer being 11 Å. The results of checking through a differential interference contrast optical microscope revealed that there were no defects lager than 0.05 micron in the membrane.

Further experiments were made at elevated sub-phase temperatures of 30° C., 40° C., 60° C. and 80° C., respectively. As a result, it was found that the shapes of FA curves and the reproducibility of the LB membranes did not change. The same results were obtained with inorganic additives dissolved in the sub-phase at the temperatures above. The additives used were 0.1N-HCl, 0.1N-NaOH, and saturated NaCl, respectively.

These LB membrane samples were placed under a dry argon atmosphere at 100° C. for 12 hours so as to be then observed through the microscope and the membrane thickness was then measured. It was seen that these LB membrane samples did not change.

EXAMPLE 4

The counter electrode was formed according to the process of the Comparative Example 1 on the LB membrane composed of 20 PDtBF layers obtained by the process of Example 3, in order to measure the electrical conductivity It was seen that good insulating properties of not higher than $10^{-13}$ S/cm at 20° C. were exhibited while the results of temperature rise tests revealed that no changes were found in the insulating properties until the temperature reached 160° C. The ITO/PDtBF-LB membrane/Al three-layer structure with the membrane being composed of one layer was equivalent to a thyristor and exhibited current density-electric potential characteristics proper to the thyristor.

EXAMPLE 5

The surface pressure to surface area curve (FA curve) was formulated by following the procedure of Example 1 except that a 1 mg/ml solution of PDcHF of Referential Example 3 in place of PDiPF in chloroform was used. The results are as shown by a curve (c) in FIG. 1. The LB membrane composed of 20 heaped layers was formulated at the surface pressure of 20 dyne/cm. The total membrane thickness was 220 Å, with the membrane thickness for each layer being 11Å. The results of observation through a differential interference contrast optical microscope revealed that the membrane defects larger than 0.05 micron were not found in the membrane sample.

Further experiments were made at elevated sub-phase temperatures of 30° C., 40° C., 60° C. and 80° C., respectively. As a result, it was found that the shapes of FA curves and the reproducibility of the LB membranes did not change. The same results were obtained with inorganic additives dissolved in the sub-phase at the temperatures above. The additives used were 0.1N-HCl, 0.1N-NaOH, and saturated NaCl, respectively.

The LB membrane was placed under an argon atmosphere at 100° C. for 12 hours so as to be then checked under the microscope and the membrane thickness was then measured. It was seen that the membrane sample did not change.

EXAMPLE 6

The counter electrode was formed on the LB membrane of Example 5 similarly to the Comparative Example 1 in order to measure the electrical conductivity. It was seen that good insulating properties of not higher than $10^{-13}$ S/cm were exhibited while no changes in the insulating properties were seen to occur in the temperature rise tests until the temperature of 160° C. was reached. The ITO/PDcHF-LB membrane/Al three-layer structure was equivalent to the thyristor and exhibited current density-electric potential characteristics proper to the thyristor.

The practical utility of the polyfumarate LB membrane of the present invention will become apparent from inspection of the above results.

EXAMPLE 7

LB membranes of polyfumarate (PDiPF) (Degree of polymerization of 700) were prepared similarly to the Example 1 but under the conditions shown in Table 1 Run Nos. 1 to 9). It is noted that, in the Run No. 10 of the present Example, poly(perfluoroctylethyl- isopropyl fumarate) (PC8F17/iPF) having a degree of polymerization of 400 was prepared by the method similar to Referential Example 1 and the LB membrane was formulated using 1 mg/ml solution of PC8F17/iPF in 1, 1, 2-trichloro-1, 2, 2-trifluloroethane, similarly to Example 1. The results are shown in Table 1.

TABLE 1

| Ex. 7 Run No. | Number of Times of Verticle Dipping | Up-Down Speed of Substrate Plate (mm/min) | Temp. (°C.) | Substrate Plate | Thickness of Membrane (Å) |
|---|---|---|---|---|---|
| 1 | 20 | 8 | 40 | ITO | 410 |
| 2 | 50 | 10 | 60 | i-Si | 540 |
| 3 | 60 | 7 | 70 | Silica Glass | 675 |
| 4 | 30 | 10 | 30 | Al | 320 |
| 5 | 55 | 8 | 65 | Pt | 570 |
| 6 | 5 | 10 | 35 | GaP | 50 |
| 7 | 2 | 5 | 20 | InP | 22 |
| 8 | 2 | 10 | 20 | n-Si | 22 |
| 9 | 2 | 10 | 20 | Glass | 22 |
| 10 | 5 | 10 | 20 | Glass | 50 |

EXAMPLE 8

LB membranes of polyfumarate (PDiPF) having a degree of polymerization of 700 were prepared similarly to Example 1 but using the conditions shown in Table 2. The results of observation through a differential interference contrast optical microscope similarly to the Example 1 revealed that the membrane defects larger than 0.05 micron in size were not found in the membrane samples.

These LB membrane samples were placed at 100° C. for 12 hours under an argon atmosphere so as to be then observed through the microscope and the membrane thickness was then measured. It was seen that no changes were caused in the membrane samples. The counter electrode was provided similarly to the Comparative Example 1 in order to measure the current density-electric potential characteristics. The results are as shown in Table 2. There were no changes in these characteristics in the temperature rise tests until the temperature of 160° C. was reached.

TABLE 2

| Ex. 8 Run No. | Thickness of Membrane (Å) | Substrate Plate | Counter Electrode | Preparation of Electrode | Type of Element | Rectification Ratio |
| --- | --- | --- | --- | --- | --- | --- |
| 1 | 10 | ITO | Al | Vacuum Deposition | MIM | |
| 2 | 11 | i-Si | Al | Vacuum Deposition | MIS | $7.5 \times 10^2$ |
| 3 | 11 | p-Si | n-Si | Contacted | SIS | |
| 4 | 20 | Pt | Al | Vacuum Deposition | MIM | $4.7 \times 10^2$ |
| 5 | 10 | GaP | Al | Vacuum Deposition | MIS | $1.3 \times 10^3$ |
| 6 | 10 | InP | Al | Vacuum Deposition | MIS | $2.2 \times 10^3$ |
| 7 | 10 | GaAs | In | Vacuum Deposition | MIS | $3.7 \times 10^3$ |
| 8 | 22 | $SnO_2$ | Al | Vacuum Deposition | MIS | $9.6 \times 10^2$ |
| 9 | 11 | NiO | Al | Vacuum Deposition | MIS | $1.8 \times 10^2$ |

EXAMPLE 9

Various polyfumarates were synthesized using the procedure similar to that of the Referential Examples and LB membranes were formulated using 1 mg/ml solution in chloroform in accordance with Example 1. The results are shown in Table 3. Incidentally, a degree of polymerization of polyfumarate used in Run Nos. 1 to 5 was 800, 750, 650, 350 and 400, respectively.

TABLE 3

| Ex. 9 Run No. | Polyfumarate | Number of Times of Vertical Dipping | Up-Down Speed of Substrate Plate (mm/min) | Temp. (°C.) | Substrate Plate | Thickness of Membrane (Å) |
| --- | --- | --- | --- | --- | --- | --- |
| 1 | PCNE/iPF | 20 | 10 | 20 | Glass | 220 |
| 2 | PGl/iPF | 5 | " | " | ITO | 55 |
| 3 | PPO/iPF | 5 | " | " | Glass | 60 |
| 4 | PS/iPF | " | " | " | ITO | 55 |
| 5 | PSi/iPF | " | " | " | Glass | 70 |

PCNE/iPF: Poly(2-cyanoethyl isopropyl fumarate)
PGl/iPF: Poly(glycidyl isopropyl fumarate)
PPO/iPF: Poly(diethyl phosphonoethyl isopropyl fumarate)
PS/iPF: Poly(2-ethylthioethyl isopropyl fumarate)
PSi/iPF: Poly[3-tris(3-trimethylsiloxy)silyl propyl isopropyl fumarate]

EXAMPLE 10

The counter electrode was provided in accordance with the Comparative Example 1 using polyfumarate of Example 9 (Run Nos. 1 to 5) and poly(2-perfluorooctylethyl isopropyl fumarate), hereafter abbreviated to $PF_{17}$/iPF (Run No.6). The results and the various conditions used are shown in Table 4. Incidentally, a degree of polymerization of polyfumarate used in Run Nos. 1 to 6 was 800, 750, 650, 350, 400 and 250, respectively.

TABLE 4

| Ex. 10 Run No. | Polyfumarate | Thickness of Membrane (Å) | Substrate Plate | Counter Electrode | Preparation of Electrode | Type of Element | Rectification Ratio |
| --- | --- | --- | --- | --- | --- | --- | --- |
| 1 | PCNE/iPF | 11 | ITO | Al | Vacuum Deposition | MIS | $5.3 \times 10^2$ |
| 2 | PGl/iPF | 11 | " | " | Vacuum Deposition | " | $6.7 \times 10^2$ |
| 3 | PPO/iPF | 12 | " | " | Vacuum Deposition | " | $1.6 \times 10^2$ |
| 4 | PS/iPF | 12 | " | " | Vacuum Deposition | " | $3.7 \times 10^2$ |
| 5 | PSi/iPF | 14 | " | " | Vacuum Deposition | " | $1.7 \times 10^3$ |
| 6 | $PF_{17}$/iPF | 15 | " | " | Vacuum Deposition | " | $4.8 \times 10^3$ |

EXAMPLE 11

Figure 3:
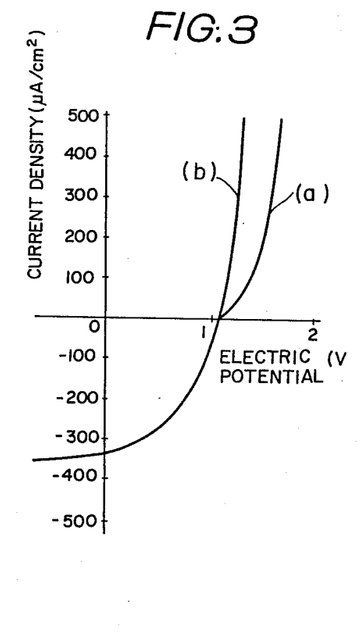
FIG. 3 is a chart showing current density-electric potential characteristics for a MIS type element of Example 11 in the dark and in the light, that is, under the white light of 0.4 mW/cm².

An LB membrane composed of one PDiPF layer (Degree of polymerization of 700) was prepared by following the procedure of Example 1 except that i-Si was used as the substrate. As the counter electrode, an aluminum layer was formed to a thickness of about 200 Å in accordance with the Comparative Example 1 and the current density-electric potential properties were measured at 20° C. It was thus seen that good rectification properties as shown by a curve (a) in FIG. 3 were observed and that the i-Si/PDiPF-LB membrane/Al three-layer structure acts as the MIS type element. It was also seen that, since the curve (b) in FIG. 3 was obtained when irradiating the element with white light of 0.4 mW/cm$_2$, the element also exhibited photo-voltaic cionversion properties.

EXAMPLE 12

An LB membrane was formed similarly to the Example 1 except using GaP as the substrate plate. After the one-layer PDiPF (Degree of polymerization of 700) was formed, a counter electrode was formed similarly to the Comparative Example 1. From the results of measurement of the current density-electric potential properties, it was seen that this GaP/PDiPF-LB membrane/Al three-layer structure acts as the MIS type element. The photovoltaic convension effect was seen from the fact that photo current occurred when irradiating the element with white light of 0.4 mW/cm$_2$. It was also seen that the element emitted light when the reverse potential of 3 V was applied in the dark so that it was possible to make use in the field of light emitting diode and electro-luminescence display.

EXAMPLE 13

An LB membrane was formed similarly to the Example 12 except using (GaP)$_{0.9}$-As$_{0.1}$ as the substrate. After formation of one layer PDiPF (Degree of polymerization of 700), a counter electrode was formed similarly to the Comparative Example 1. The element emitted red light when under the d.c. voltage of 5 V so that it was also possible to make use in the field of light emitting diode electroluminescence display.

Although the present invention has been described with reference to the specific examples, it should be understood that various modifications and variations can be easily made by those skilled in the art without departing from the spirit of the invention. Accordingly, the foregoing disclosure should be interpreted as illustrative only and not to be interpreted in a limiting sense. The present invention is limited only by the scope of the following claims.

What is claimed is:

1. A Langmuir-Blodgett ultrathin membrane having one or more monomolecular layers, each layer including a uniform molecluar orientation, the membrane constituted of polyfumarate having a degree of polymerization of 20 to 10,000 and obtained by polymerization fumarate represented by the general formula:

wherein R$_1$ and R$_2$ represent the same or different groups and at least one of R$_1$ and R$_2$ represents a hydrocarbon group selected from the group consisting of a branched alkyl group having 3 to 12 carbon atoms, a cycloalkyl group having 3 to 12 carbon atoms, a substituted alkyl group having 2 to 6 carbon atoms and containing a ring structure substituent having 3 to 14 carbon atoms, and a substituted cycloaklyl group having 3 to 10 carbon atoms and containing a second ring structure substituent having 3 to 14 carbon atoms; trifluoromethyl, pentafluoroethyl, heptafluoro-n-propyl, or a fluorine-substituted hydrocarbon group obtained by substituted at least one or hydrogen atoms of said hydrocarbon group with a fluorine atom; and herero atom-containing hydrocarbon group containing in said hydrocarbon group a herero atom selected from the group consisting of nitrogen, oxygen, phosphorus and sulfur atoms and not containing mobile hydrogen atom or atoms; or an organosilyl group, an organosilylalkyl group, an organosiloxanyl group, an organosiloxanylalkyl group, an organosiloxanylsilylalkyl group or an organosiloxanyloxysilylalkyl group, each having 1 to 8 silicon atoms.

2. A Langmuir-Blodgett ultrathin membrane as claimed in claim 1 wherein said fumarate is selected from the group consisting of dicyclohexyl fumarate, dicyclopentyl fumarate, isopropylcyclohexyl fumarate, ethylcyclohexyl fumarate, sec-butylcyclohexyl fumarate, t-butylcyclohexyl fumarate, allylbenzyl fumarate, cyclohexylbenzyl fumarate, di-iso-propyl fumarate, isopropylbenzyl fumarate, isopropylphenyl fumarate, cyclohexylphenyl fumarate, di-iso-butyl fumarate, tert-butyl-methyl fumarate, tert-butyl-ethyl fumarate, tert-butyl-iso-propyl fumarate, tert-butyl-n-propyl fumarate, tert-butyl-n-butyl fumarate, tert-butyl-iso-butyl fumarate, tert-butyl-sec- butyl fumarate, di-tert-butyl fumarate, tert-butyl- cyclopentyl fumarate, tert-butyl-cyclohexl fumarate, tert-butyl-2-ethylhexyl fumarate, tert-butyl-biscyclohexyl fumarate, tert-butyl-benzyl fumarate, tert-butyl-phenetyl fumarate, tert-butyl-α-phenetyl fumarate and di-iso-pentyl fumarate.

3. A Langmuir-Blodgett ultrathin membrane as claimed in claim 1 wherein said fumarate is selected from the group consisting of perfluorooctylethyl-isopropyl fumarate, trifluoromethyl-isopropyl fumarate, pentafluoroethyl-isopropyl fumarate, and heptafluoro-n-propyl-isopropyl fumarate.

4. A Langmuir-Blodgett ultrathin membrane as claimed in claim 1 wherein said fumarate is selected from the group consisting of cyanoethyl-isopropyl fumarate, glycidyl-isopropyl fumarate, diethylphosphonomethylisopropyl fumarate and 2-methylthioethyl-isopropyl fumarate.

5. A Langmuir-Blodgett ultrathin membrane as claimed in claim 1 wherein said fumarate is selected from the group consisting of methyl-(trimethylsilyl)-fumarate, ethyl-(trimethylsilyl)-fumarate, isopropyl-(trimethylsilyl)fumarate, cyclohexyl-(trimethylsilyl)-fumarate, tert-butyl(trimethylsilyl)-fumarate, methyl-(trimethylsilyl) methyl-fumarate, ethyl-(3-trimethylsilyl) propyl-fumarate, isopropyl-(trimethylsilyl)methyl-fumarate, isopropyl-(3-trimetylsilyl)propyl-fumarate, isopropyl-{3-tris (trimethylsiloxy)silyl} propyl-fumarate, isopropyl-3{methylbis(trimethylsiloxy)silyl} propyl-fumarate, t-butyl-(trimethylsilyl)ethyl-fumarate, t-butyl-3-{tris (trimethylsiloxy)silyl} propyl-fumarate, t-butyl-3 -{(heptamethyl)trisiloxanyl} propyl-fumarate, 2-ethylhexyl-3-(trimethylsilyl)propyl-fumarate, 2-ethylhexyl-3- {tris-(trimethylsiloxy)siyl} propyl-fumarate, 2-ethylhexyl-3-{(pentamethyl)disiloxanyl} propyl-fumarate, cyclohexyl- {(trimethyl)silyl} methyl-fumarate, cyclohexyl-3- {tris (trimethylsiloxy)silyl} propyl-fumarate, isopropyl-3 -{(penta-methyl)disiloxanyl} propyl-fumarate, isopropyl-3 -[}(tris (pentamethyl)disiloxanyloxy}silyl] propypl-fumarate, cyclohexyl-3-[{(tris(-pentamethyl) disiloxanyloxy}silyl] propyl-fumarate and t-butyl-3-[{tris(pentamethyl)disiloxanyloxy}silyl] propyl-fumarate.

6. An electrical element containing a Langmuir-Blodgett ultrathin membrane according to claim 1 as an insulating layer.

7. An electrical element as claimed in claim 6 wherein the element is a MIM type element.

8. An electrical element as claimed in claim 6 wherein the element is a MIS type element.

9. An electrical element as claimed in claim 6 wherein the element is a SIS type element.

* * * * *

UNITED STATES PATENT AND TRADEMARK OFFICE
CERTIFICATE OF CORRECTION

PATENT NO. : 4,907,038

DATED : March 6, 1990

INVENTOR(S) : KIYOTAKA SHIGEHARA et al.

It is certified that error appears in the above—identified patent and that said Letters Patent is hereby corrected as shown below:

Col. 16, line 1: Change "herero" to --hetero--.

Col. 16, line 3: Change "herero" to --hetero--.

Signed and Sealed this

Sixteenth Day of July, 1991

*Attest:*

HARRY F. MANBECK. JR.

*Attesting Officer*   *Commissioner of Patents and Trademarks*